United States Patent [19]

Brown

[11] 4,185,243

[45] Jan. 22, 1980

[54] METHOD AND APPARATUS FOR PROVIDING A STANDBY SIGNAL

[75] Inventor: Kenneth H. Brown, Scottsdale, Ariz.

[73] Assignee: Motorola Inc., Schaumburg, Ill.

[21] Appl. No.: 885,841

[22] Filed: Mar. 13, 1978

Related U.S. Application Data

[63] Continuation of Ser. No. 729,043, Oct. 4, 1976, abandoned.

[51] Int. Cl.² .............................................. H04B 1/16
[52] U.S. Cl. .................................... 325/364; 325/409
[58] Field of Search .................. 325/2, 400, 402, 403, 325/363, 478, 492, 364, 348, 473, 408, 409; 328/169

[56] References Cited

U.S. PATENT DOCUMENTS 3,358,234  12/1967  Stover .................................. 325/330

Primary Examiner—Marc E. Bookbinder
Attorney, Agent, or Firm—M. David Shapiro

[57] ABSTRACT

The disclosed signal generating apparatus and method is suitable for use in combination with a PM receiver to provide a standby signal for a signal processor. The standby signal system includes a clipper connected to the receiver IF; a coherent amplitude detector coupled between the clipper and a gain controlled amplifier; and a trigger circuit coupled between the coherent amplitude detector and the signal processor. The trigger circuit provides a standby signal in response to the level of the output signal of the coherent amplitude detector passing through a predetermined threshold level in response to the clipper limiting on a selected signal-to-noise ratio which occurs before the information signal becomes undesirably weak.

8 Claims, 2 Drawing Figures

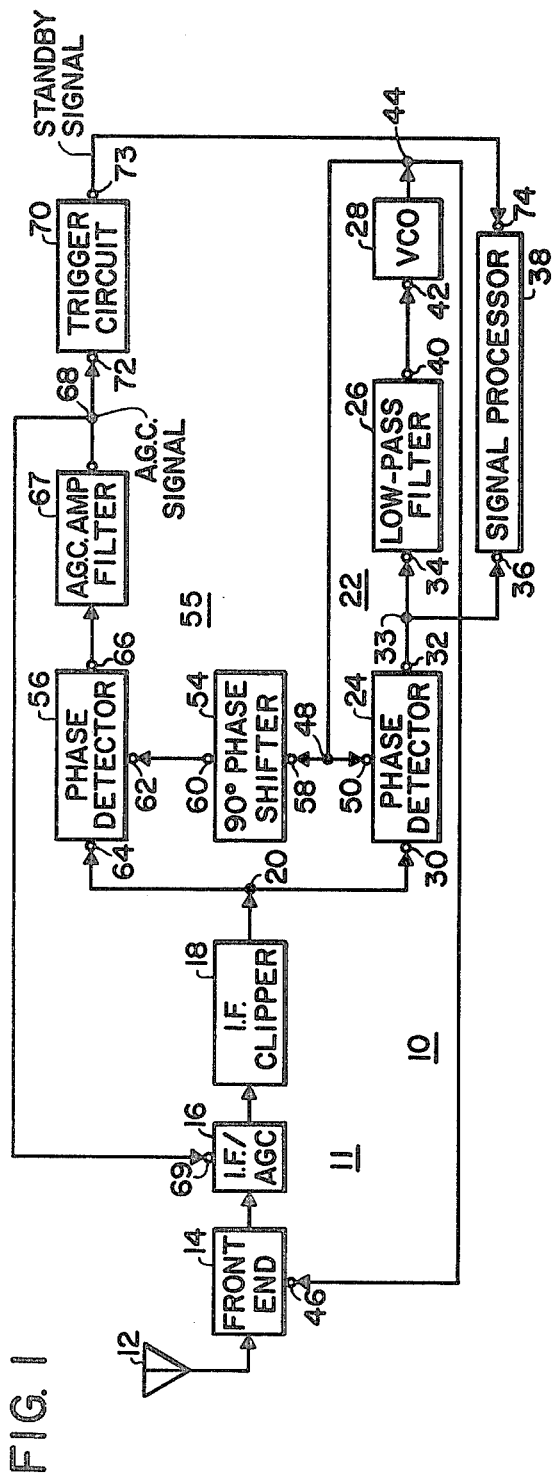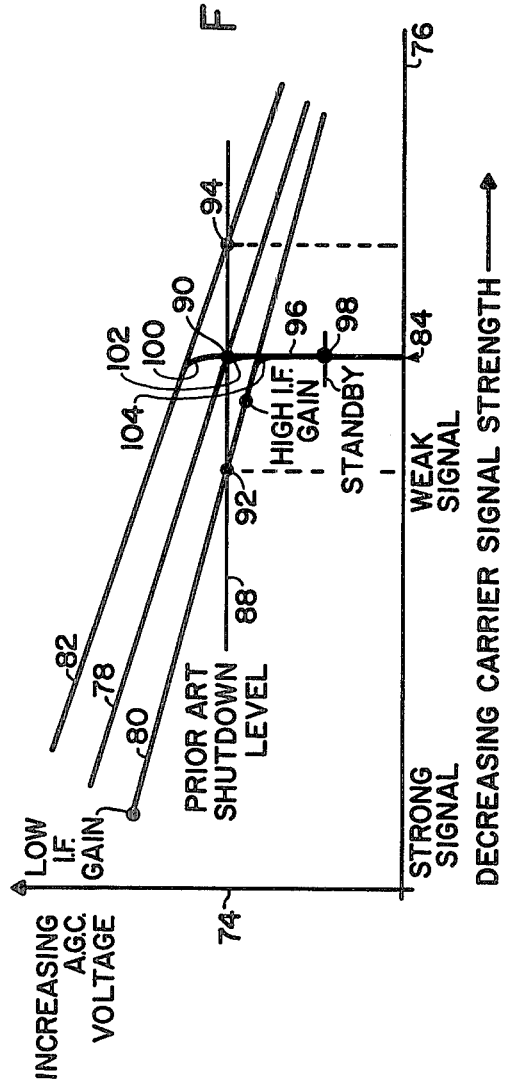

METHOD AND APPARATUS FOR PROVIDING A STANDBY SIGNAL

This is a continuation of application Ser. No. 729,043, filed Oct. 4, 1976, now abandoned.

BACKGROUND OF THE INVENTION

Electronic apparatuses and methods for providing standby signals are utilized in many types of present day communication equipments. Such apparatuses include circuits and systems which enable the conservation of electrical power, which may be supplied by a battery, when either a too weak signal or no signal is being received by a receiver associated with the communication equipment. Moreover, such apparatuses prevent false triggering of noise sensitive circuits by rendering them inoperative as the signal-to-noise ratio reaches a critically low magnitude. Noise sensitive circuits may include digital logic systems, for instance, which could generate improper command signals in response to noise.

Prior art standby signal generating systems and methods have been utilized with phase modulation (PM) receivers which include a superheterodyne type frequency converter coupled to an intermediate frequency (IF) amplifier. Such standby systems include an amplitude detector connected from the output terminal of the IF back to the gain control terminal of an amplifier which is situated in the signal path before the output terminal of the IF amplifier. The amplitude detector develops an automatic gain control (AGC) signal in response to the amplitude of the carrier component present in the signal at the output terminal of the IF amplifier. More particularly, as the carrier signal strength tends to decrease, the magnitude of the AGC voltage changes to cause the increase in gain necessary to maintain the carrier signal at the output of the IF amplifier at a substantially constant magnitude. The AGC voltage versus signal strength characteristic for such receivers is substantially linear and flat. A magnitude sensitive trigger circuit is generally coupled to the detector and produces the standby signal in response to the magnitude of the AGC signal crossing a predetermined threshold. The standby signal causes the shutdown of selected portions of the signal processing equipment connected to the receiver, for the purposes set forth above.

The above described prior art standby system and method has disadvantages which makes them unsuitable for use in some high performance equipment such as telemetry transponders being utilized in satellites. More specifically, the magnitude of the AGC signal in the aforementioned prior art system varies with change in gain and other parameters of any of the receiver stages. Since this gain is a function of temperature and age, the shutdown threshold level for the trigger circuits in prior art systems are usually chosen quite conservatively which results in the sacrifice of operating performance particularly at low signal strengths.

SUMMARY OF THE INVENTION

It is a primary object of the present invention to provide an improved method and apparatus for providing standby signals.

Another object of the invention is to provide a standby signal developing apparatus and method which is suitable for use with a superheterodyne, phase modulation receiver and which provides a standby signal that is substantially independent of changes in gain and other parameters of the receiver amplifiers.

A further object of the invention is to provide a system and method for generating a standby signal which enables the signal processing equipment associated therewith to remain operative at weak signal strengths and which reduces the risk of signals having undesirably low signal-to-noise levels being applied to said signal processing equipment.

Briefly, the electronic system for providing a standby signal for a signal processor includes a clipper circuit, a detector circuit and a trigger circuit. The clipper circuit is adapted to receive an input signal having information components and noise. The clipper provides a predetermined change in the output signal at an output terminal thereof in response to the input signal reaching a predetermined signal-to-noise level, which occurs prior to a predetermined lower limit of the input signal strength. The detector circuit, which is coupled to the output terminal of the clipper circuit, provides a characteristic curve of control signal versus incoming signal strength which has an increased slope in response to the predetermined change in the output signal of the clipper circuit. The trigger circuit, which is coupled between the detector circuit and the signal processor, provides a standby signal in response to the output of the detector circuit which is a function of the increased slope of the characteristic curve of the control signal versus the decreasing incoming signal strength.

BRIEF DESCRIPTION OF THE DRAWINGS

FIG. 1 is a block diagram of a communication system including a standby signal system of one embodiment of the invention; and FIG. 2 is a graph showing relationships between AGC voltage magnitude, signal strength and standby signal threshold levels.

DETAILED DESCRIPTION OF THE PREFERRED EMBODIMENT

Block diagram 10 of FIG. 1 shows a communication system having a superheterodyne PM receiver, a standby system of one embodiment of the invention, and a signal processor. Receiver portion 11 includes front end 14, IF/AGC amplifier 16, IF clipper 18, and phase lock loop (PLL) 22. Antenna 12 applies PM input signals having undesired noise and desired information components to front end 14, which includes amplifier and mixer circuits for down-converting the frequency of the input signal components so that they are within the band-pass of IF/AGC amplifier 16. The converted signals are amplified by amplifier 16 and applied to IF clipper or limiter 18 which is connected between the output terminal of IF amplifier 16 and circuit junction 20.

PLL 22 includes phase detector 24, low pass filter 26, and voltage controlled oscillator (VCO) 28. Input terminal 30 of phase detector 24 is connected to circuit junction 20 and output terminal 32 is connected to input terminal 34 of low pass filter 26 and through to PLL output terminal 33 to input terminal 36 of the signal processor 38. VCO 28 has an input terminal 42 which is connected to output terminal 40 of low pass filter 26 and an output terminal 44 which is connected both to input terminal 46 of front end 14 and to circuit junction 48, which is connected to control terminal 50 of PLL phase detector 24 and to input terminal 58 of 90° phase shifter 54. PLL 22 responds to the phase of the carrier component of the IF output signal occurring at junction 20 to provide a demodulated information signal at circuit junction 33, in a manner well understood in the art. Under normal operating conditions, signal processor 38 utilizes the demodulated information signal in some desired manner. The output signal of oscillator 28 facilitates the down-conversion of the receiver input signal in the mixer portion of front end 14.

Ninety-degree phase shifter 54 and phase detector 56 cooperate with phase lock loop 22 to form coherent amplitude detector (CAD) 55 which is responsive to the magnitude of the carrier frequency component at output terminal 20 of IF clipper 18. It is important to note that the AGC signal produced at junction 68 is responsive only to the carrier signal level within the linear region of operation of the system and not to the noise present in the system since this is a coherent AGC system. But unlike prior art coherent AGC systems, the coherent AGC signal of the preferred embodiment of the invention is developed from the output of clipper 18. More specifically, input terminal 58 of phase shifter 54 is connected through junction 48 to receive the output signal of oscillator 28. The phase shifted oscillator output signal is coupled from phase shifter output terminal 60 to one input terminal 62 of CAD phase detector 56. The output of IF limiter 18 is connected through junction 20 to another input terminal 64 of phase detector 56. Phase detector 56 then performs coherent amplitude detection in a manner known in the art to provide an AGC control voltage at terminal 66 which is proportional only to the magnitude of the carrier component included in the signal at output terminal 20 of IF limiter 18 and is not responsive to noise within the linear range. AGC amplifier/filter 67, which is connected between terminal 66 and junction 68, amplifies the AGC signal. Circuit junction 68 is connected to control terminal 69 of amplifier 16 to effectuate gain control. CAD 55 and AGC amplifier 67 form a high gain feedback loop which tends to keep the magnitude of the carrier signal component at terminal 20 at relatively constant magnitude regardless of the signal-to-noise ratio of the input signal until IF clipper 18 limits on noise. It will be appreciated that since the AGC signal responds only to carrier signal level and thus the gain of IF AGC controlled amplifier 16 increases with a decreasing input signal level, the noise level into clipper 18 increases due to the increased gain until it is large enough to cause clipping in clipper 18.

Trigger circuit 70 includes an input terminal 72 which is connected to junction 68 for receiving the AGC voltage and an output terminal 73 which is connected to control terminal 74 of signal processor 38 to provide standby operation thereof in response to either no signal or a predetermined weak signal strength to respectively conserve power or prevent undesired operation.

FIG. 2 is a graph of increasing AGC voltage plotted along ordinate axis 74 with respect to decreasing signal strength plotted along abscissa axis 76. Line segments or portions 78, 80 and 82 represent the gain characteristic of receiver 10 at differing temperatures, for instance. These line segments have slight negative slopes and depict the linear region of operation of the AGC system. It is assumed that the weakest signal desired to be applied to signal processor 38 is represented by point 84 on axis 76. Since the AGC system tends to keep the magnitudes of information signal components constant by tending to keep the magnitude of the carrier signal constant, point 84 can also be considered as representing a minimum, clipper signal-to-noise level. In prior art systems, the threshold level of trigger circuit 70 may have been set at the level designated by horizontal line 88 which intersects portions 78, 80 and 82 so as to keep the AGC system in the linear region until after shutdown. Thus, if the receiver was operating on the AGC characteristic represented by line 78, the shutdown signal would be generated by trigger circuit 79 at point 90 in response to the gain characteristic crossing threshold 88. Thus, shutdown would then occur at the lowest signal strength 84 to be tolerated. If conditions changed and the receiver began operating on the AGC characteristic designated by line 80 then shutdown would occur at point 92 before the weakest signal strength 84 was reached thereby sacrificing performance. If an unusual situation arose such that receiver 11 operated on gain characteristic 82, then shutdown would not occur until point 94 was reached thereby enabling weaker than desired signals to be applied to signal processor 38 and thereby possibly causing undesired operation.

To solve the aforementioned problems encountered when receiver 10 operated on characteristic 80 or 82, according to the present invention, IF clipper 18, which is a conventional clipper circuit well known in the art, limits on noise at a signal strength corresponding to the weakest desired signal level which is illustrated as point 84 on axis 76. Consequently, regardless of which gain characteristic the receiver is operating on, the random signal out of IF clipper 18 then results in the magnitude of the output signal of AGC amplifier/filter 67 changing on a greater or steeper negative magnitude slope, for instance. This is indicated by line portion or segment 96. The sharp knees 100, 102, and 104 associated with line 96 are caused by the nonlinear loop gain of the AGC feedback system upon commencement of clipping by IF clipper 18. PLL 22 operates in a suppressed carrier mode and remains locked while the system operates on segment 96.

Also, according to the invention the predetermined threshold of trigger circuit 70 is set at a level represented by point 98 which is chosen to intersect line segment 96. Thus, the generation of the standby trigger signal is no longer a function of the gain of the preceding receiver stages as in the prior art systems. Threshold level 98 can be chosen to maximize receiver performance under weak signal conditions without creating the danger of signals having too little strength being applied to signal processor 38. Hence, according to the invention, the choice of the trigger threshold of circuit 70 depends on the front end noise figure, the IF bandwidth, the IF clipper, and the reference for the trigger.

Thus, what has been described is an improved method and apparatus for providing standby signals for a signal processor. More specifically, the standby signal apparatus and method is suitable for use with a superheterodyne, PM or FM receiver and provides a standby signal which is substantially independent of changes in gain and other parameters of the amplifiers of the receiver, Moreover, the system and method enables the signal processing equipment associated therewith to remain operative at weak signal strengths while ensuring that signals having strengths below a predetermined minimum level are not applied thereto.

I claim:

1. In a coherent automatic gain control circuit having a gain controlled amplifier, an input signal derived from an antenna and a coherent amplitude detector, wherein a gain control voltage is derived from an output terminal of the coherent amplitude detector and the gain control voltage is applied to the gain controlled amplifier to control the gain of the gain controlled amplifier, the gain controlled amplifier having an output terminal, the coherent amplitude detector having an input terminal, the improvement comprising:

clipper means for noise limiting, said clipper means having an input terminal connected to the output terminal of the gain controlled amplifier, said clipper means having an output terminal connected to the input terminal of the coherent amplitude detector;

front end means for amplifying and down converting said input signal, said amplified and down converted input signal being fed to an input of said gain controlled amplifier;

phase locked loop means for generating a reference signal, said phase lock loop means being coupled to said output terminal of said clipper means, said reference signal from said phase locked loop menas being coupled to said front end means and said reference signal from said phase lock loop being coupled to the coherent amplitude detector;

trigger means for generating a standby signal, said trigger means having an input terminal and an output terminal, said input terminal being coupled to the output terminal of the coherent amplitude detector, said output terminal of said trigger means providing said standby signal thereon; and signal processor means for further processing the input signal, said signal processor means having first and second input terminals, said first input terminal being coupled to an output of said phase locked loop means, said second input terminal being coupled to said output terminal of said trigger means, said signal processor means being operably responsive to said standby signal.

2. The circuit according to claim 1 wherein the coherent amplitude detector comprises an automatic gain control signal amplifier and a low pass filter, said automatic gain control signal amplifier having an output coupled to an input of said low pass filter, said low pass filter having an output terminal, said low pass filter output terminal being the output terminal of the coherent amplitude detector.

3. An electronic system for providing a standby signal in response to an incoming signal, the incoming signal including a carrier and noise, the system comprising in combination:

first means for amplifying the incoming signal, said first means having a gain level responsive to a coherent automatic gain control signal on an input terminal thereof;

clipper means for noise limiting, said clipper means being driven by an output signal from said first means, said clipper means having an output terminal;

coherent detection means for producing said coherent automatic gain control signal at an output terminal thereof, said coherent detection means having an input coupled to said output terminal of said clipper means, said coherent detector means having an input terminal for receiving a reference signal;

means for generating said reference signal, said generating means having an input coupled to said output terminal of said clipper means, said generating means having an output terminal for coupling said reference signal to said input terminal for receiving said reference signal at said coherent detector means;

a trigger circuit having input and output terminals, said input terminal being connected to said output terminal of said coherent detection means, the standby signal being on said output terminal of said trigger circuit; and signal processor means for further processing of the incoming signal, said signal processor means having a signal input terminal connected to an output of said generating means, said signal processor means having a standby signal terminal input connected to said output terminal of said trigger circuit.

4. The system according to claim 3 wherein said generating means comprises a phase locked loop circuit.

5. The system according to claim 3 wherein said coherent detector means comprises:

a phase detector having a phase shifted reference signal input terminal, an input signal terminal and an output terminal;

a phase shift circuit having an input terminal which is said reference signal input terminal, said phase shift circuit having an output terminal being connected to said phase shifted reference signal input terminal.

6. The system according to claim 5 wherein said coherent detector means comprises:

second amplifier means for amplifying an automatic gain control signal, said second amplifier means having an input and output terminal, said input terminal of said second amplifier means being connected to said output terminal of said phase detector;

a filter having an input and output terminal, said input terminal of said filter being connected to said output terminal of said second amplifier means, said output terminal of said filter being an output terminal of said coherent detector means.

7. An automatic method for providing a standby signal for a phase modulation receiving system comprising the steps of:

(a) receiving a composite noise and input carrier signal of varying amplitudes;

(b) amplifying said varying composite signal in an automatic gain controlled amplifier;

(c) clipping the amplified composite signal at a first predetermined amplitude level;

(d) detecting the varying amplitude of only the carrier signal by means of a coherent amplitude detector;

(e) controlling the gain of said automatic gain controlled amplifier responsive to an output of said coherent amplitude detector so that said amplified and clipped carrier signal is held at a constant amplitude essentially equal to said first predetermined amplitude level whenever said varying input carrier signal exceeds a second predetermined amplitude and so that said amplified and clipped carrier signal is held below said constant amplitude when said varying input carrier signal is below said second predetermined amplitude, said gain of said automatic gain controlled amplifier increasing at a significantly faster rate responsive to said input carrier signal being below said second predetermined level than when said input carrier level exceeds said second predetermined level and causing the noise signal to be limited by said clipping step to said first predetermined amplitude level; and
(f) providing a standby signal in response to the amplitude of said output of said coherent amplitude detector crossing a threshold level.

8. The method according to claim 7 wherein said detecting step further comprises the steps of:
amplifying and filtering said detected signal before said controlling step.

* * * * *